United States Patent
Nakamuta et al.

(10) Patent No.: US 8,436,665 B2
(45) Date of Patent: May 7, 2013

(54) DIGITAL PLL CIRCUIT AND CLOCK GENERATING METHOD

(75) Inventors: Koji Nakamuta, Kawasaki (JP); Yoshito Koyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/418,721

(22) Filed: Mar. 13, 2012

(65) Prior Publication Data

US 2012/0242386 A1 Sep. 27, 2012

(30) Foreign Application Priority Data

Mar. 22, 2011 (JP) .................................. 2011-063109

(51) Int. Cl.
*H03L 7/06* (2006.01)

(52) U.S. Cl.
USPC .......................................... 327/156; 327/147

(58) Field of Classification Search .................. 327/147, 327/156
See application file for complete search history.

(56) References Cited

U.S. PATENT DOCUMENTS

| | | | | |
|---|---|---|---|---|
| 6,493,408 | B1* | 12/2002 | Kobayashi | 375/357 |
| 6,636,575 | B1* | 10/2003 | Ott | 375/376 |
| 6,774,732 | B1 | 8/2004 | Harnishfeger et al. | |
| 7,221,727 | B2* | 5/2007 | Co | 375/376 |
| 7,339,861 | B2 | 3/2008 | Minamino et al. | |
| 2004/0207475 | A1 | 10/2004 | Minamino et al. | |
| 2011/0234327 | A1* | 9/2011 | Kobayashi | 331/1 R |
| 2012/0025879 | A1* | 2/2012 | Matsuda | 327/156 |
| 2012/0069884 | A1* | 3/2012 | Sakurai | 375/224 |
| 2012/0087225 | A1* | 4/2012 | Honma | 369/59.19 |
| 2012/0242386 | A1* | 9/2012 | Nakamuta et al. | 327/159 |

FOREIGN PATENT DOCUMENTS

JP 2004-343724 12/2004
JP 2006-518151 8/2006

* cited by examiner

*Primary Examiner* — Adam Houston
(74) *Attorney, Agent, or Firm* — Staas & Halsey LLP

(57) ABSTRACT

A digital PLL circuit includes: a digital phase comparator to detect a phase difference between a master clock and a slave clock and output a phase difference detection value; a correction circuit to correct the phase difference detection value to a phase value in accordance with a comparison result between the phase difference detection value and a threshold; and a slave clock generation circuit to generate the slave clock in accordance with the phase value.

17 Claims, 15 Drawing Sheets

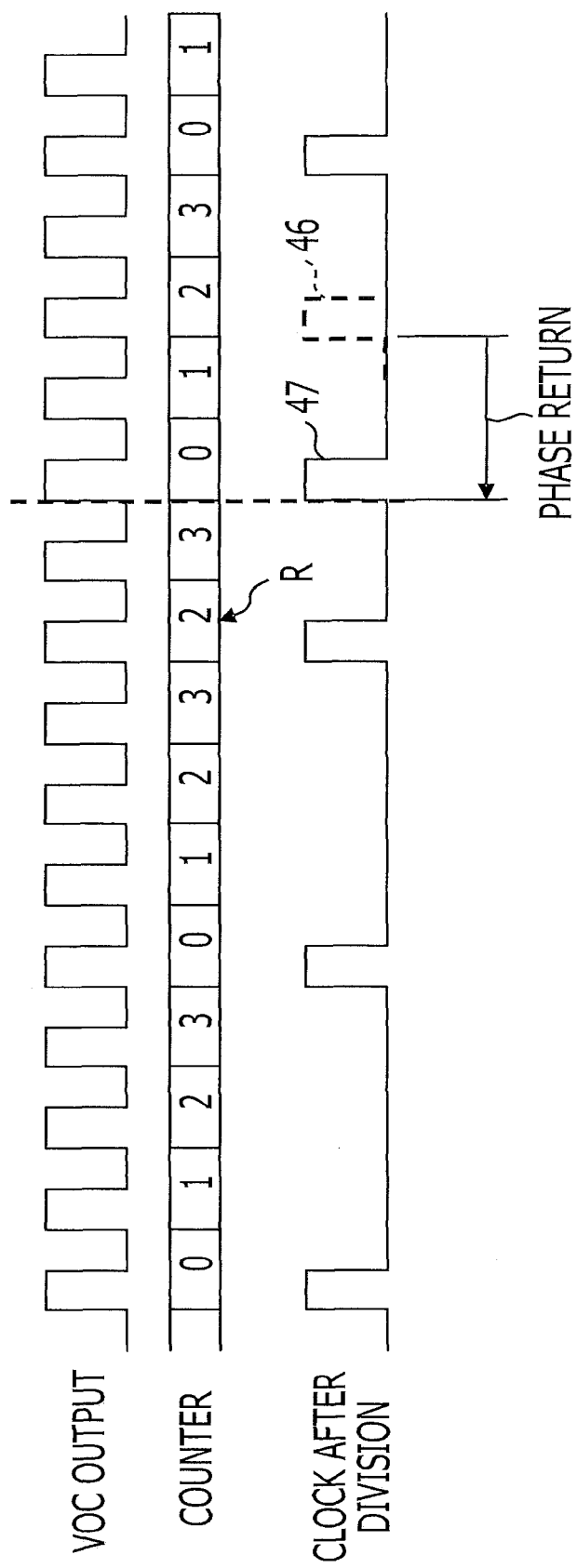

LINEAR OPERATION RANGE
OF PHASE COMPARATOR

US 8,436,665 B2

DIGITAL PLL CIRCUIT AND CLOCK GENERATING METHOD

CROSS-REFERENCE TO RELATED APPLICATION(S)

This application is based upon and claims the benefit of priority of the prior Japanese Patent Application No. 2011-63109, filed on Mar. 22, 2011, the entire contents of which are incorporated herein by reference.

FIELD

The embodiments discussed herein are related to an electronic circuit.

BACKGROUND

A digital Phase Locked Loop (PLL) circuit includes a digital phase comparator, a digital loop filter, a DA converter, a voltage controlled oscillator, a divider, and a phase count clock generator. The digital phase comparator receives a phase count clock from the phase count clock generator and also receives a master clock (reference clock) from an external clock source and a slave clock (divisional clock) from the divider. The digital phase comparator counts a phase difference between the master clock and the slave clock as the number of pulses of the phase count clock. A count value indicating the phase difference is subjected to time averaging by the digital loop filter, and the count value after the averaging is converted by the DA converter into an analog voltage. The voltage controlled oscillator oscillates a clock signal of a frequency in accordance with the analog voltage. The oscillated clock signal is divided by the divider at a certain divisional ratio, and the divisional clock signal is applied to the digital phase comparator as the slave clock. Through a feedback control, the oscillated clock signal of the voltage controlled oscillator is controlled so that the frequency of the master clock becomes substantially equal to the frequency of the slave clock and also the phases have a certain phase relationship.

Related art is disclosed in Japanese Laid-open Patent Publication No. 2004-343724, Japanese National Publication of International Patent Application No. 2006-518151, or the like.

SUMMARY

According to one aspect of the embodiments, a digital PLL circuit includes: a digital phase comparator to detect a phase difference between a master clock and a slave clock and output a phase difference detection value; a correction circuit to correct the phase difference detection value to a phase value in accordance with a comparison result between the phase difference detection value and a threshold; and a slave clock generation circuit to generate the slave clock in accordance with the phase value.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7 illustrates an exemplary process of a divider having the phase control function.

DESCRIPTION OF EMBODIMENTS

A digital phase comparator included in a digital PLL circuit counts a time difference between a pulse of a master clock and a pulse of a subsequent slave clock as the number of pulses of the phase count clock to detect a phase difference. Since the pulse is detected within 1 cycle, the detected phase difference may take a value in a range between $-\pi$ and $+\pi$. If the phase difference is increased to be larger than $+\pi$, the phase difference appears on the $-\pi$ side. If the phase difference is decreased to be smaller than $-\pi$, the phase difference appears on the $+\pi$ side.

For example, when the phase difference abruptly transits between an upper end and a lower end in a range between $-\pi$ and $+\pi$, an operation for performing a phase matching of the slave clock to the master clock by the PLL circuit, for example, a pull-in operation may be delayed. For example, since the phase difference converging through a feedback control oscillates during the pull-in operation, a pull-in time may be lengthened (cycle slip).

The pull-in time of an ideal PLL may be set based on a natural frequency and a dumping factor. When the natural frequency is high and the dumping factor is small, the pulling-in may be fast, or the cycle slip may be reduced. For that reason, a parameter at the time of the pulling-in and a parameter at the time of the locking may be switched. When the natural frequency is high or the dumping factor is small, a stability of a loop may be reduced. A circuit scale may be increased to switch the parameters. When the cycle slip is generated, the pull-in time may be calculated through a simulator analysis.

Figure 1:
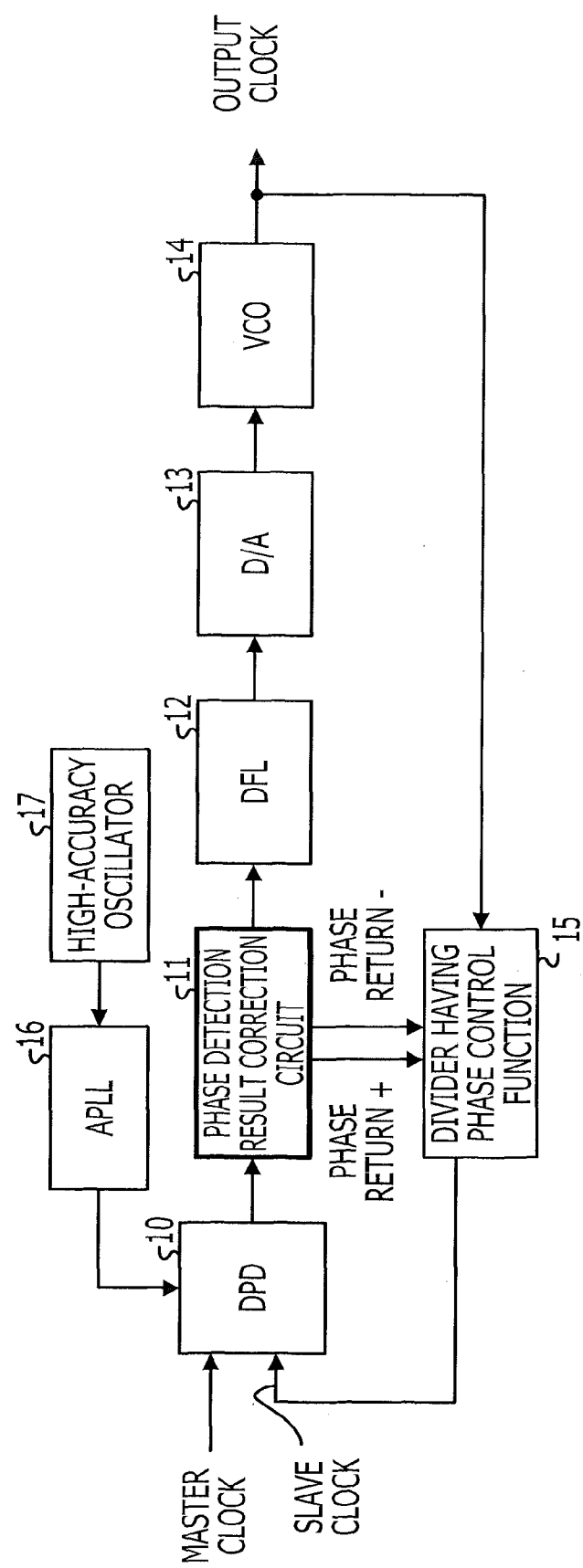
FIG. 1 illustrates an exemplary digital PLL circuit.

In the respective drawings, a boundary between functional blocks indicated by boxes indicates a functional border and may not correspond to a separation of physical positions, a separation of electrical signals, a control logical separation, or the like in some cases. The functional block in hardware may be a hardware module physically separated from another functional block and also may be one function in a hardware module physically integrated with another functional block. FIG. 1 illustrates an exemplary digital PLL circuit. The digital PLL circuit illustrated in FIG. 1 includes a digital phase comparator (DPD) 10, a phase detection result correction circuit 11, a digital loop filter (DLF) 12, a DA converter (D/A) 13, a voltage controlled oscillator (VCO) 14, and a divider 15 having the phase control function. The digital PLL circuit further includes an analog PLL (APLL) 16 and a high-accuracy oscillator 17 as a phase count clock generator. The analog PLL 16 multiplies an oscillation signal of the high-accuracy oscillator 17 to generate a clock signal for a high-accuracy high-frequency phase count.

The digital phase comparator 10 detects a phase difference between the master clock and the slave clock and outputs, for example, a phase difference detection value in which a length takes a value within a range of $2\pi$. For example, the digital phase comparator 10 receives a phase count clock from the analog PLL and also receives a master clock from an external clock source, for example, a reference clock and a slave clock from the divider 15 having the phase control function, for example, a divisional clock. The digital phase comparator 10 counts the phase difference between the master clock and the slave clock as the number of pulses of the phase count clock and outputs the count result as the phase difference detection value. The phase difference detection value may be a digital value, for example, indicating a phase difference within a range between 0 and $2\pi$. A lower limit and an upper limit of the range may be arbitrary, and the range may be a range of 0 and $2\pi$ or a range of $-\pi$ to $+\pi$. The range may be set based on a setting of a reference point of phase zero or a setting on a left end and a right end of the range.

The phase detection result correction circuit 11 corrects the phase difference detection value to a phase value that is not limited by the range in accordance with a result of a comparison between the phase difference detection value and a threshold. The digital loop filter 12, the DA converter 13, the voltage controlled oscillator 14, and the divider 15 having the phase control function generate a slave clock. The slave clock may be generated in accordance with the phase value after the correction output by the phase detection result correction circuit 11. For example, the phase value after the correction is subjected to time averaging by the digital loop filter 12, and the count value after the averaging is converted by the DA converter 13 into an analog voltage. The voltage controlled oscillator 14 oscillates a clock signal of a frequency in accordance with this analog voltage. The oscillated clock signal is divided by the divider 15 having the phase control function at a certain division ratio, and the divisional clock signal is applied to the digital phase comparator 10 as a slave clock. Through the feedback control, the oscillated clock signal of the voltage controlled oscillator 14 is controlled so that the frequency of the master clock is substantially equal to the frequency of the slave clock and also the phases have a certain phase relationship.

Figure 2:
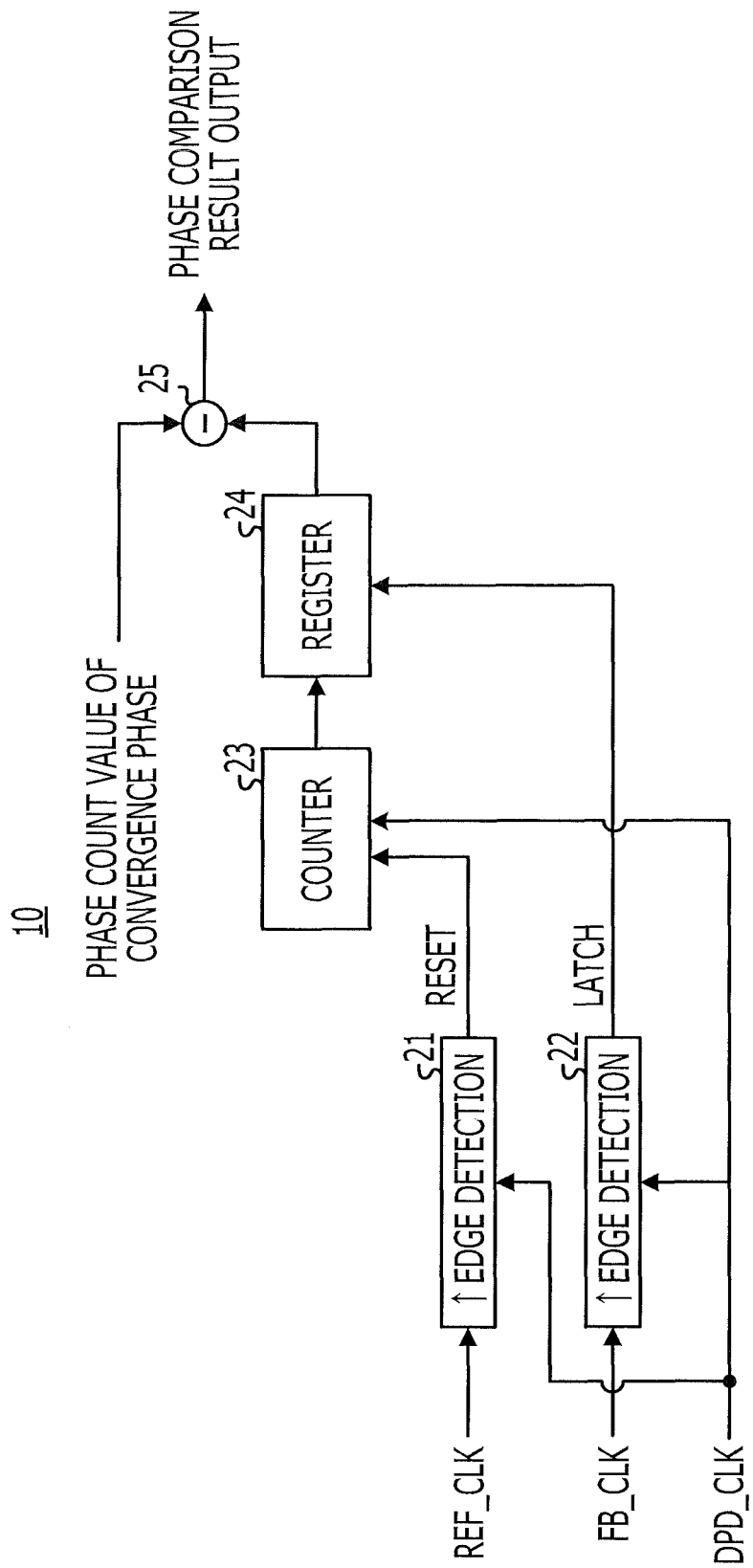
FIG. 2 illustrates an exemplary digital phase comparator.

FIG. 2 illustrates an exemplary digital phase comparator. The digital phase comparator illustrated in FIG. 2 may be the digital phase comparator 10 illustrated in FIG. 1. The digital phase comparator 10 illustrated in FIG. 2 includes a rising edge detector 21, a rising edge detector 22, a counter 23, a register 24, and a subtractor 25. The rising edge detector 21 detects a rising edge of a master clock (reference clock) REF_CLK and asserts an output. The rising edge detector 22 detects a rising edge of a slave clock (feedback clock) FB_CLK and asserts an output. The counter 23 counts up by one in synchronization with respective pulses of a phase count clock DPD_CLK and is reset to zero by the assertion of the output of the rising edge detector 21. The register 24 takes in and holds the output count value of the counter 23 in response to the assertion of the output of the rising edge detector 22. The subtractor 25 subtract the phase count of the convergence phase from the count value stored in the register 24 and outputs the phase comparison result, for example, the phase difference detection value.

Figure 3:
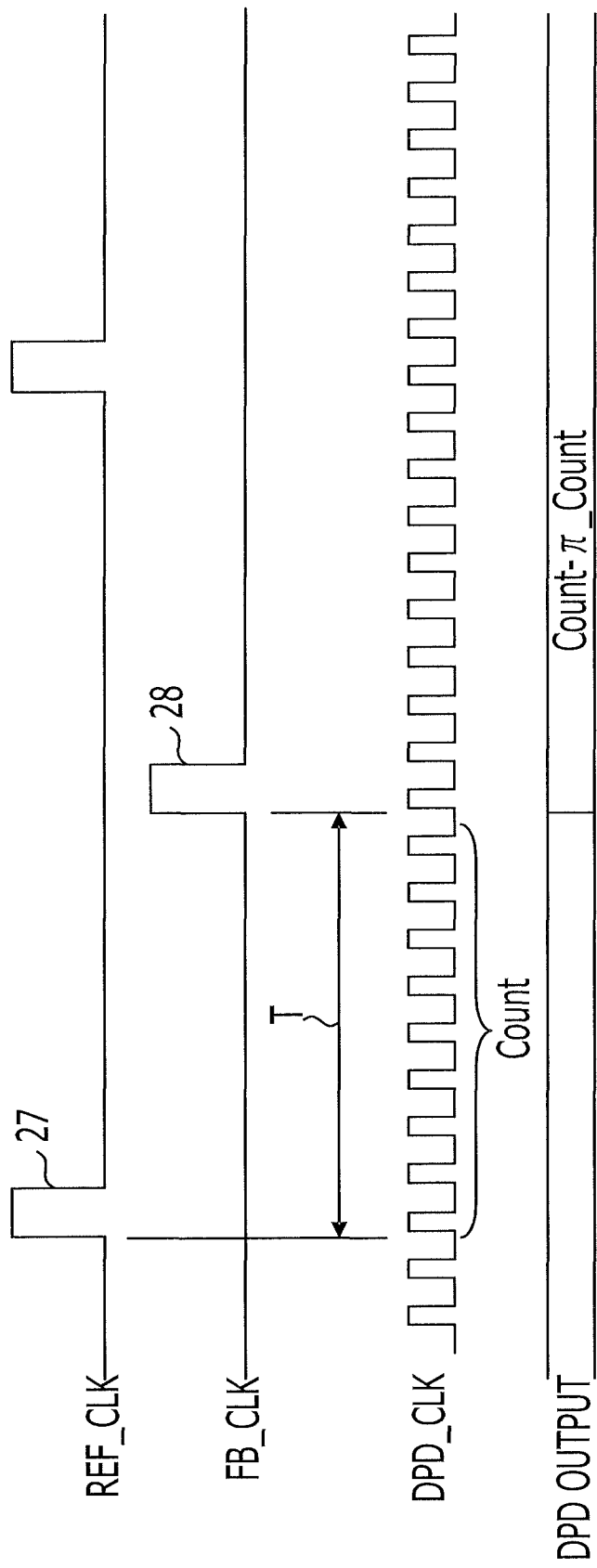
FIG. 3 illustrates an exemplary process of a digital phase comparator.

FIG. 3 illustrates an exemplary process by the digital phase comparator. The process illustrated in FIG. 3 may be executed by the digital phase comparator 10 illustrated in FIG. 2. The counter 23 counts the pulse number of the phase count clock DPD_CLK during a period from the rising edge of the pulse 27 of the master clock REF_CLK to the rising edge of the pulse 28 of the slave clock FB_CLK. Count illustrated in FIG. 3 indicates the counted pulse number. The counted value Count may correspond to a period length T from the rising edge of the pulse 27 to the rising edge of the pulse 28. The digital phase comparator 10 outputs Count $-\pi\_$Count as the phase difference detection value based on the count result. $\pi\_$Count indicates the phase count of the convergence phase. For example, when the pulse of the slave clock FB_CLK converges at a center position of the range between 0 and $2\pi$, for example, a position of the phase $\pi$, for example, an intermediate position between adjacent two pulses of the master clock REF_CLK, $\pi\_$Count may be a count value corresponding to the phase $\pi$. When a stable state is established after the pull-in operation is completed by the digital PLL circuit, the phase difference detection value Count $-\pi\_$Count may be a value in the vicinity of zero.

Figure 4:
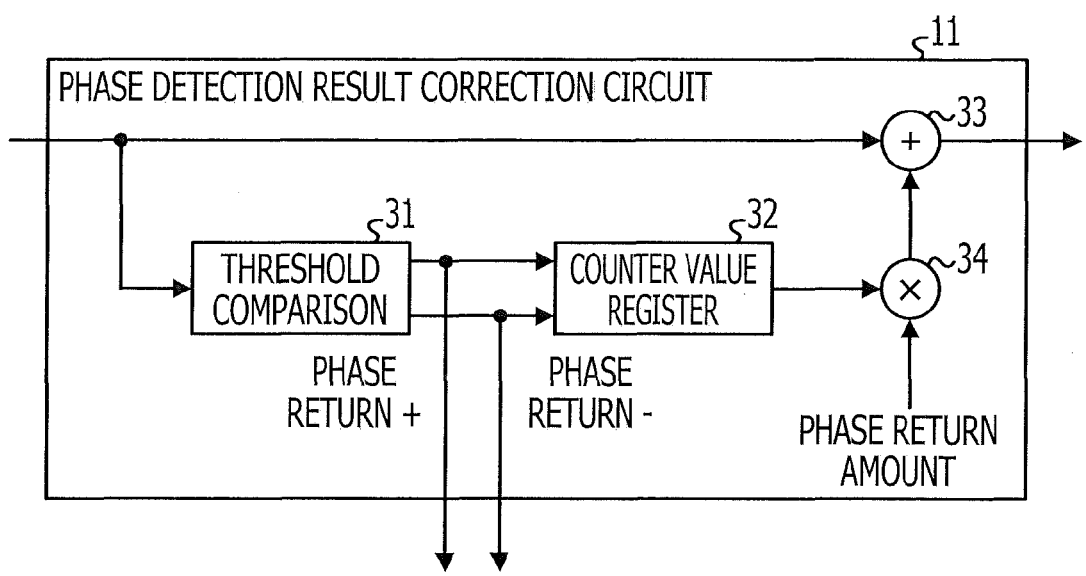
FIG. 4 illustrates an exemplary phase detection result correction circuit.

FIG. 4 illustrates an exemplary phase detection result correction circuit. The phase detection result correction circuit illustrated in FIG. 4 may be the phase detection result correction circuit illustrated in FIG. 1. The phase detection result correction circuit 11 includes a threshold comparison circuit 31, a count value register 32, an adder 33, and an integrator 34. The threshold comparison circuit 31 compares the phase difference detection value from the digital phase comparator 10 with a threshold. A comparison result may include a first state, a second state, or a third state. In a range between 0 and $2\pi$, the threshold may include a first threshold located on a side where the phase is smaller as compared with the center of the range and a second threshold located on a side where the phase is larger as compared with the center of the range. The first state may be a state in which the phase difference detection value is smaller than the first threshold, for example, a state in which the phase difference detection value is closer to the zero side in the range between 0 and $2\pi$. The second state may be a state in which the phase difference detection value is larger than the second threshold, for example, a state in which the phase difference detection value is closer to the end of $2\pi$ side in the range between 0 to $2\pi$. The third state may be a state in which the phase difference detection value is larger than or equal to the first threshold and also smaller than or equal to the second threshold, for example, a state in which the phase difference detection value exists at a location not close to both ends in the range between 0 and $2\pi$.

The count value register 32 stores the count value and also increases or decreases the count value by 1 in accordance with an instruction from the threshold comparison circuit 31. When the threshold comparison circuit 31 detects the first state, the "phase return +" illustrated in FIG. 4 is asserted, and the count value of the count value register 32 is decreased by 1. When the threshold comparison circuit 31 detects the second state, the "phase return –" illustrated in FIG. 4 is asserted, and the count value of the count value register 32 is increased by 1. When the threshold comparison circuit 31 detects the third state, the "phase return +" and the "phase return –" are not asserted, and the count value of the count value register 32 is held at substantially the same value as it is. The integrator 34 integrates the count value of the count value register 32 with a certain phase amount, for example, a phase return amount. The phase value after the correction may be obtained while the adder 33 adds the integrated value to the phase detection value from the phase detection result correction circuit 11.

Figure 5:
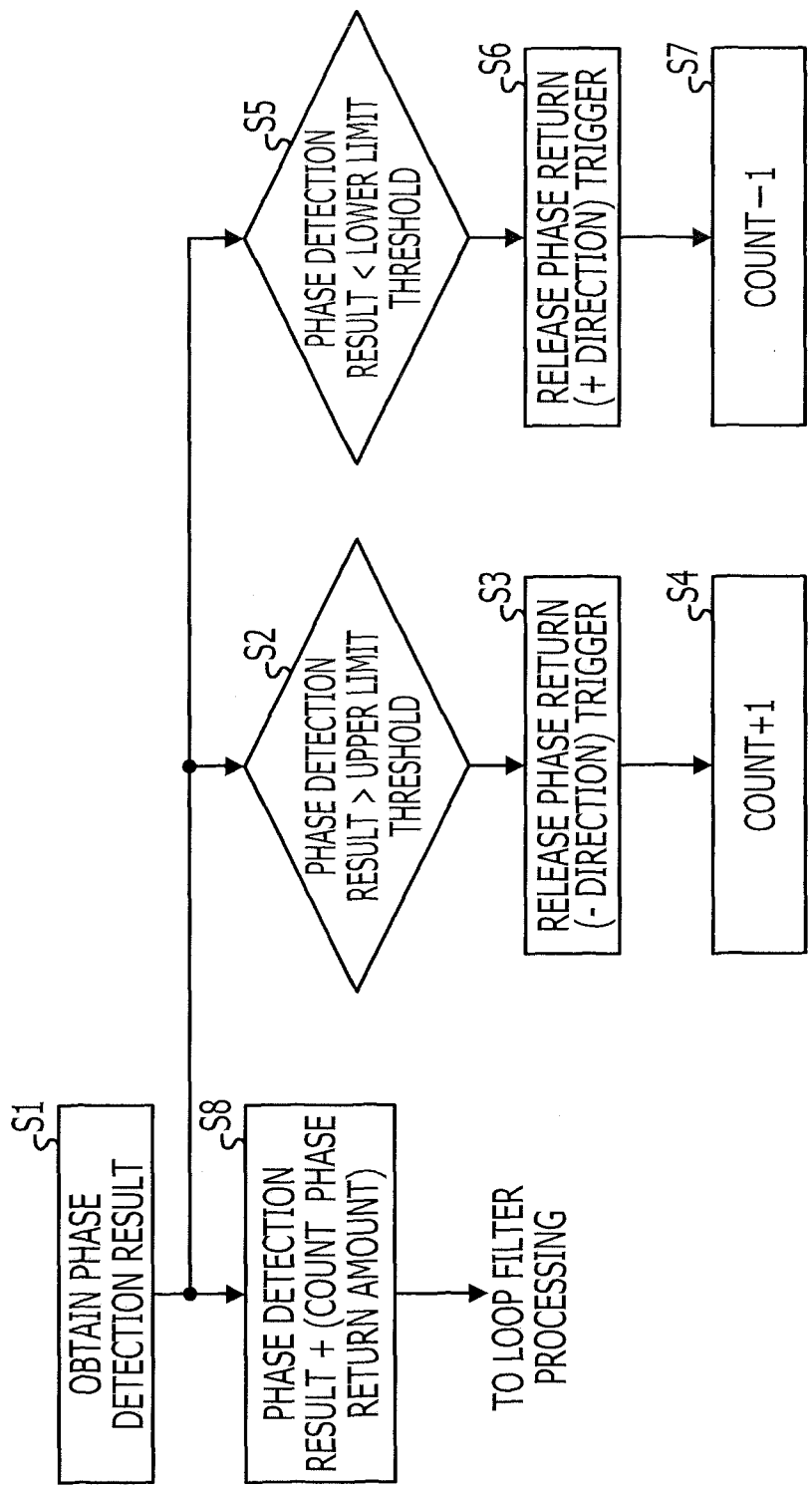
FIG. 5 illustrates an exemplary process of a phase detection result correction circuit.

FIG. 5 illustrates an exemplary process of a phase detection result correction circuit. The process illustrated in FIG. 5 may be executed by the phase detection result correction circuit 11 illustrated in FIG. 4. In an operation S1, the phase detection result from the phase detection result correction circuit 11, for example, the phase difference detection value is obtained. In an operation S2, the phase detection result is compared with an upper limit threshold, for example, the second threshold. When the phase detection result is larger than the upper limit threshold, in an operation S3, the phase return (− direction) is triggered, for example, the "phase return −" illustrated in FIG. 1 or FIG. 4 is asserted. In an operation S4, the count value COUNT of the count value register 32 is subjected to +1.

In an operation S5, the phase detection result is compared with a lower limit threshold, for example, the first threshold. When the phase detection result is smaller than the lower limit threshold, in an operation S6, the phase return (+ direction) is triggered, for example, the "phase return +" illustrated in FIG. 1 or FIG. 4 is asserted. In an operation S7, the count value COUNT of the count value register 32 is subjected to −1.

In an operation S8, the value obtained by multiplying the phase return amount by COUNT is added to the phase detection result from the phase detection result correction circuit 11, and the phase value after the correction is obtained. The phase value after the correction is supplied to a loop filter process by a slave clock generation circuit.

When the phase difference detection value is smaller than the first threshold, the phase detection result correction circuit 11 asserts the "phase return +" to instructs the divider 15 having the phase control function of the slave clock generation circuit. Based on the instruction, the divider 15 having the phase control function changes the phase of the slave clock and increases the phase difference detection value. When the phase difference detection value is larger than the second threshold, the phase detection result correction circuit 11 asserts the "phase return −" to instruct the divider 15 having the phase control function of the slave clock generation circuit. Based on the instruction, the divider 15 having the phase control function changes the phase of the slave clock and decreases the phase difference detection value.

Figure 6:
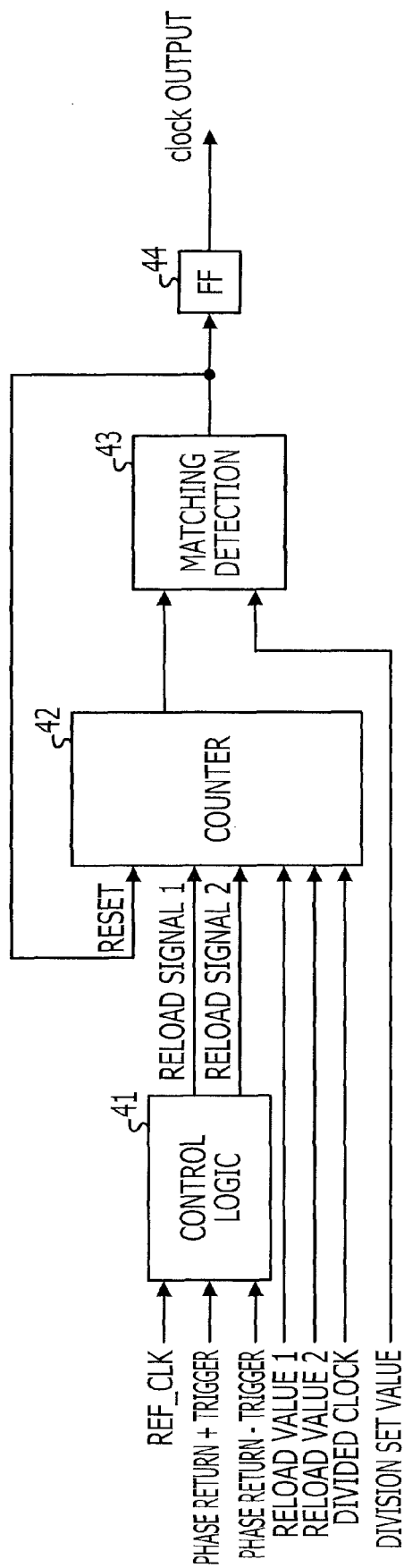
FIG. 6 illustrates an exemplary divider having a phase control function.

FIG. 6 illustrates an exemplary divider having a phase control function. The divider 15 having the phase control function illustrated in FIG. 6 may be the divider having the phase control function illustrated in FIG. 1. The divider 15 having the phase control function illustrated in FIG. 6 includes a control logic 41, a counter 42, a matching detector 43, and a flip-flop 44. The counter 42 counts up in synchronization with a pulse of a non-divided clock signal oscillated by the voltage controlled oscillator 14. When the count value output by the counter 42 is matched with a division set value, the matching detector 43 asserts the output. In response to the assertion of the output of the matching detector 43, the counter 42 is reset to zero at a timing of a pulse of the next non-divided clock signal. For example, if the division set value is 3, when the count value becomes 3, the counter 42 is reset at the next timing, and the count value is set as 0. The flip-flop 44 latches the output of the matching detector 43 using the divided clock signal as a synchronization signal. When the count value is matched with the division set value and the output of the matching detector 43 is asserted as 1, the flip-flop 44 is set to 1 in synchronization with the pulse of the next non-divided clock signal. During one cycle of the divided clock, a HIGH pulse is output as a division clock output. For example, in a case where the division set value is 3, one in every four cycles of the non-divided clock, a pulse of the division clock is output, and a division operation at a ¼ frequency is carried out.

When the "phase return +" from the phase detection result correction circuit 11 is asserted, at a rising edge of the next master clock REF_CLK, the control logic 41 asserts a reload signal 1. In response to the assertion of the reload signal 1, the counter 42 reloads a reload value 1, and the count value is set to the reload value 1. When the "phase return −" from the phase detection result correction circuit 11 is asserted, at a rising edge of the next master clock REF_CLK, the control logic 41 asserts a reload signal 2. In response to the assertion of the reload signal 2, the counter 42 reloads a reload value 2, and the count value is set as the reload value 2.

FIG. 7 illustrates an exemplary process of a divider having a phase control function. The process illustrated in FIG. 7 may be executed by the divider 15 having the phase control function illustrated in FIG. 6. In synchronization with the respective pulses of the VCO output (the divided clock signal), an operation is repeatedly carried out in which the count value of the counter 42 is increased from 0 to 3 and the count value is reset to 0. The clock after the division may be a signal divided at the ¼ frequency. At a timing indicated by R in FIG. 7, the count value "2" is reloaded in the counter 42, and thereafter, the counter value is counted up from "2". When the reload is not carried out, a pulse 46 may be output as the clock after the division. When the reload is executed, a pulse 47 is output as the clock after the division, and the phase is shifted by the certain phase amount.

Figure 8A:
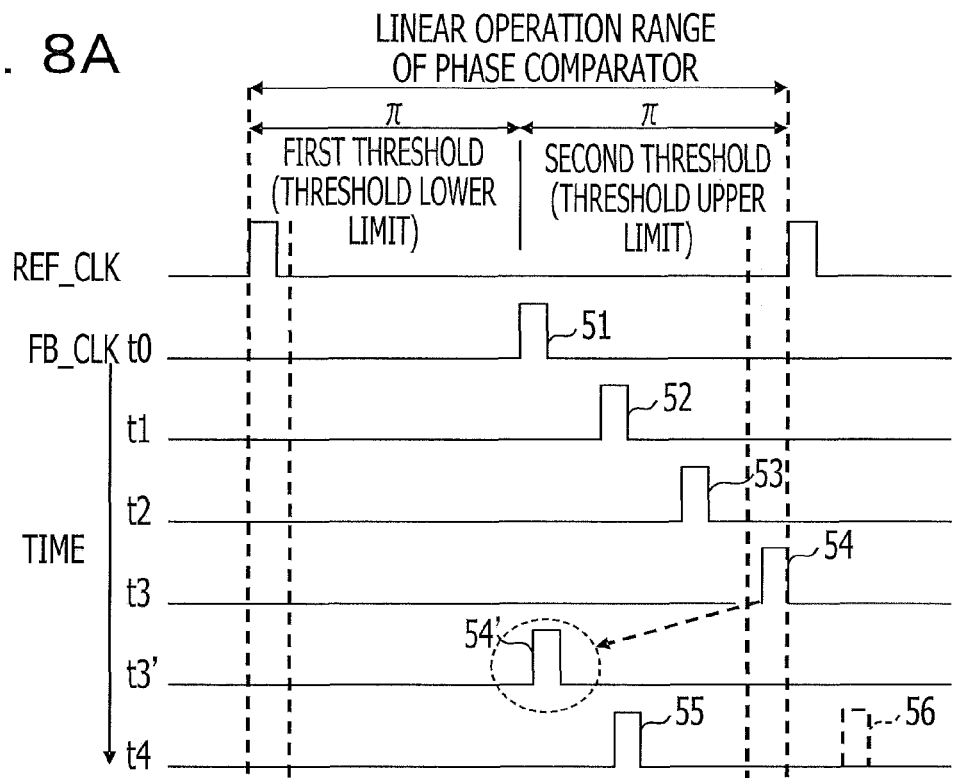
FIG. 8A and FIG. 8B illustrate an exemplary phase return operation.
Figure 8B:
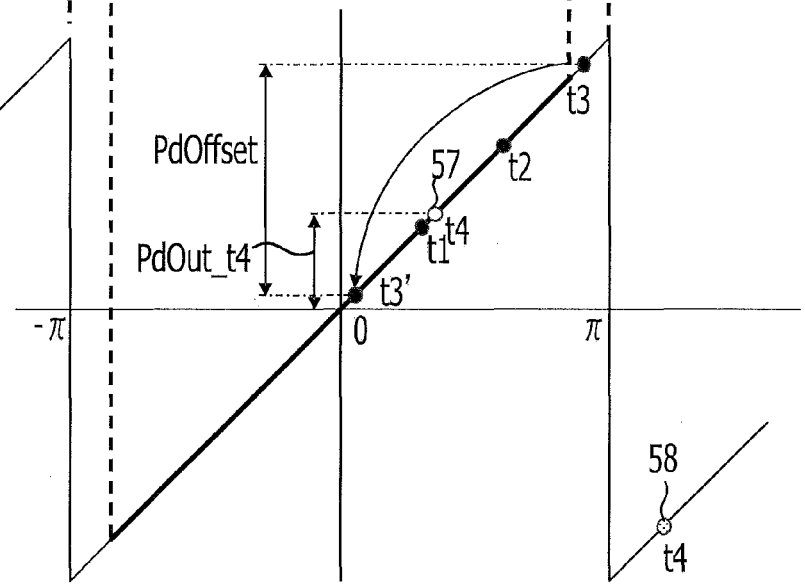

FIG. 8A and FIG. 8B illustrate an exemplary phase return operation. In FIG. 8A, the zero phase is set at an intermediate point between the pulses of the master clock REF_CLK, the pulse of the slave clock FB_CLK moves in a phase range between −π and +π. At a timing t0, a pulse 51 of the slave clock FB_CLK is output from the divider 15 having the phase control function to an illustrated phase position. At a timing t1 of the next cycle, a pulse 52 of the slave clock FB_CLK is output to the illustrated phase position. Since a frequency of the slave clock FB_CLK is smaller than a frequency of the master clock REF_CLK, from the pulse 51 to the pulse 52, the pulse position moves to the right on the drawing. At a timing t2 of the next cycle of t1, a pulse 53 of the slave clock FB_CLK is output to the illustrated phase position, and at a timing t3 of the next cycle of t2, a pulse 54 of the slave clock FB_CLK is output to the illustrated phase position. The phase difference detection value detected by the pulse 54 may be larger than the second threshold. For example, since the phase position of the pulse 54 is located on the right side on the drawing with respect to the position of the second threshold, the phase detection result correction circuit 11 asserts the "phase return −" to be supplied to the divider 15 having the phase control function.

In response to the assertion of the "phase return −", for example, the phase return instruction in the negative phase direction from the phase detection result correction circuit 11, the divider 15 having the phase control function reloads, for example, performs a reconfiguration on an internal state, for example, a count value. For that reason, the position of the pulse 54 on the drawing is returned to a position of a pulse 54'. Through the reload of the counter, the previous position of the pulse 54, for example, the position where the count value is equivalent to 0 is shifted to the position of pulse 54' in the phase range between −π and +π. At a timing t4 of the next cycle of t3, a pulse 55 of the slave clock FB_CLK is output to the illustrated phase position. When the reload is not carried out, a pulse 56 may be output as the slave clock FB_CLK.

When the reload is carried out, the pulse 55 is output as the slave clock FB_CLK, and the phase is shifted by the certain phase amount.

A horizontal axis of FIG. 8B represents a phase, and a vertical axis of FIG. 8B represents a phase value folding in a range limitation between $-\pi$ and $+\pi$. In FIG. 8B, the phase positions of the pulses of the slave clock FB_CLK at the respective timings t1 to t4, for example, the phase difference detection values are indicated. The phase positions represented by black circles in FIG. 8B indicate the phase difference detection values detected at the respective timings t1, t2, t3, and t4. Through the reload of the counter, the position of the pulse at the timing t3 shifts to the phase position indicated at a timing t3' in the phase range between $-\pi$ and $+\pi$. When the reload is not executed, the phase difference detection value at the timing t4 may be a phase position 58. When the reload is executed, the phase difference detection value at the timing t4 may be a phase position 57, and the phase is shifted by the certain phase amount. PdOffset indicates a phase amount returned through the reload, and PdOut_t4 indicates a phase difference detection value at the timing t4. When the frequency of the slave clock is substantially equal to the frequency of the master clock, the phase return amount PdOffset may be a value in accordance with the reload value. The phase return amount PdOffset may be a fixed value. To reduce unused phase return, the first threshold and the second threshold may be set at locations close to ends of the phase range between $-\pi$ and $+\pi$. When a value of an interval between the threshold and the end is small, the pulse may not be detected in the interval in some cases. The first threshold and the second threshold may be set to appropriate values.

Figure 9:
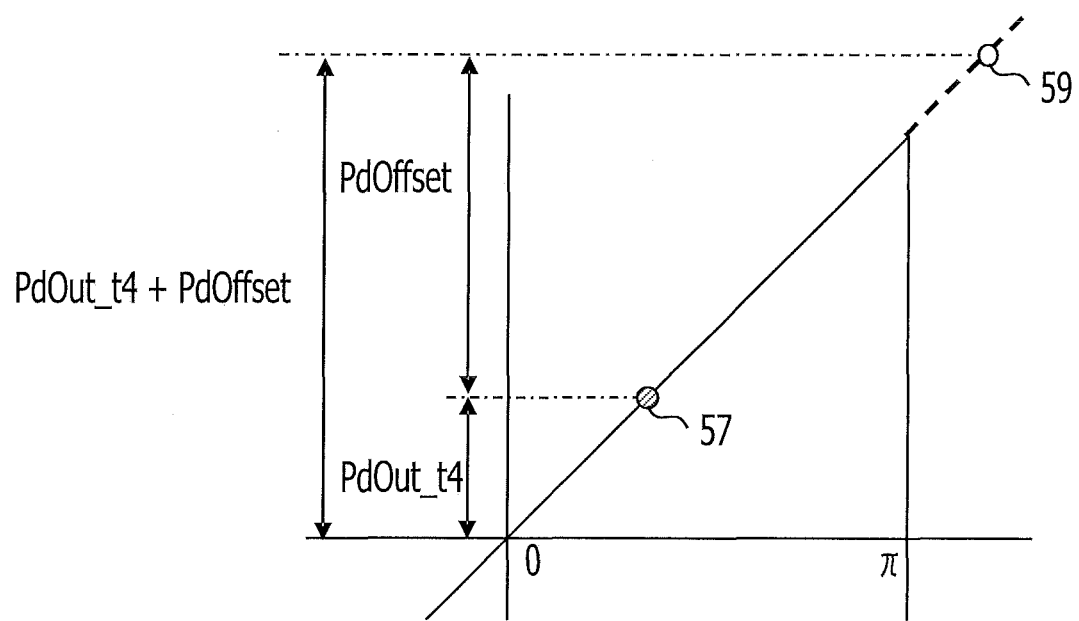
FIG. 9 illustrates an exemplary correction calculation.

FIG. 9 illustrates an exemplary correction calculation. The phase detection result correction circuit 11 illustrated in FIG. 1 or FIG. 4 may perform the correction calculation illustrated in FIG. 9. In FIG. 9, a horizontal axis represents a phase, and a vertical axis represents a phase value folding in a range limitation between 0 and $2\pi$. For example, the phase difference detection value PdOut_t4 at the timing t4 illustrated in FIG. 8 may correspond to the phase position 57. The phase difference detection value of the phase position 57, for example, the output value of the phase detection result correction circuit 11 is added with the phase return amount PdOffset to calculate the phase value after the correction at a phase position 59. The slave clock generation circuit generates the slave clock based on the phase value after the correction. In the digital PLL circuit, an influence from the folding based on the range limitation between 0 and $2\pi$ is reduced, and the high-speed pull-in operation may be carried out.

Figure 10:
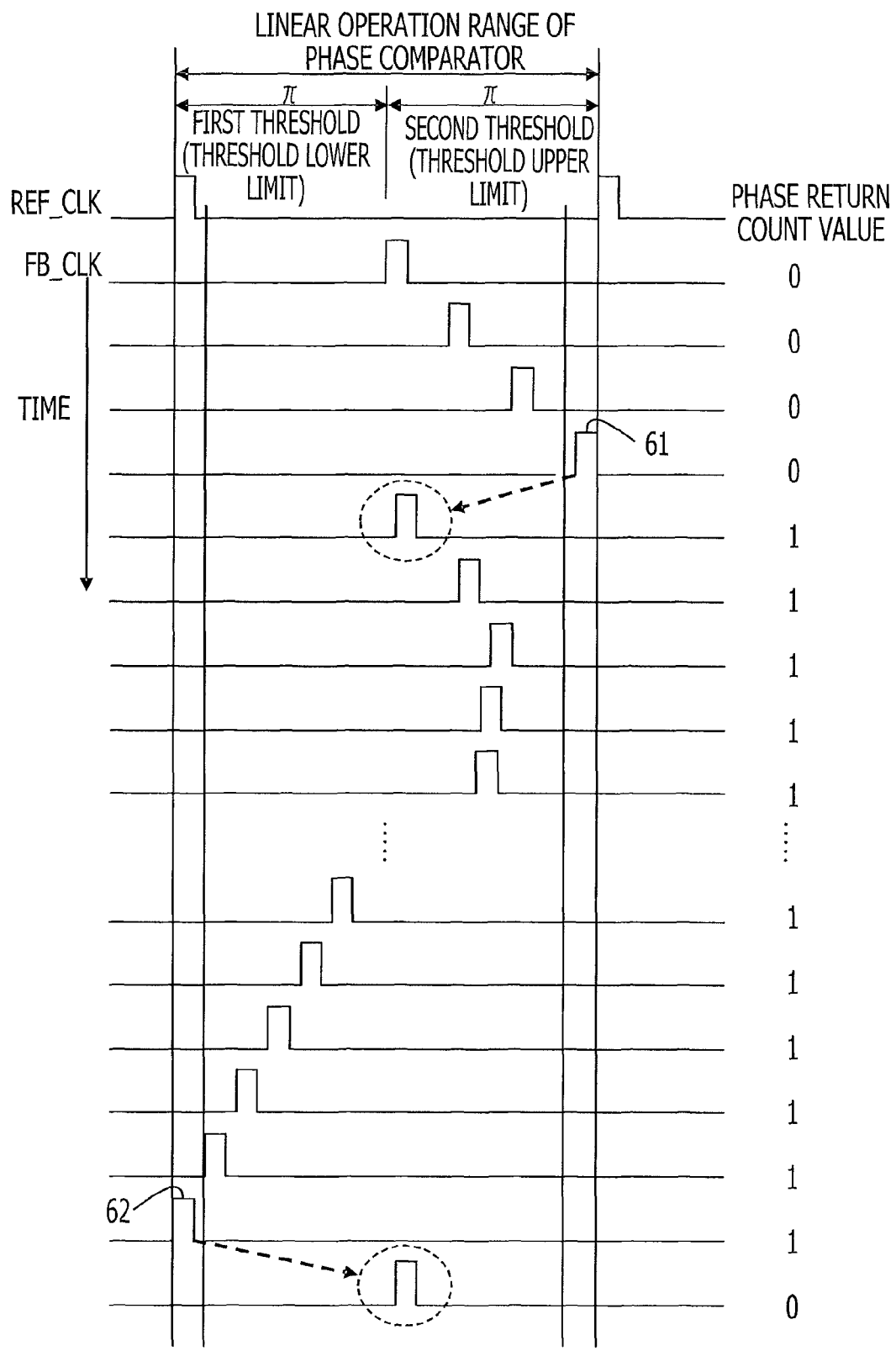
FIG. 10 illustrates an exemplary phase return operation.

FIG. 10 illustrates an exemplary phase return operation. In FIG. 10, the zero phase is set at an intermediate point between pulses of the master clock REF_CLK, and the pulse of the slave clock FB_CLK moves in the phase range between $-\pi$ and $+\pi$. A numeral on the right side of pulse waveforms at the respective timings indicates, for example, the count value stored in the count value register 32 of the phase detection result correction circuit 11 illustrated in FIG. 4, for example, the COUNT value illustrated in FIG. 5. As the time progresses from the top side to the bottom side in FIG. 10, the phase of the pulse of the slave clock FB_CLK increases. When a pulse 61 of the slave clock FB_CLK is located on the right side with respect to the second threshold, the phase return operation is executed, and the pulse position is returned to a position in the vicinity of the center of the phase range between $-\pi$ and $+\pi$. Along with the phase return operation into the negative direction, the count value is increased from 0 to 1. In FIG. 10, although the pulse position is returned to a position in the vicinity of the center of the phase range between $-\pi$ and $+\pi$, the returning position for the pulse may be arbitrary. When the pulse 61 is located on the right side with respect to the second threshold, the phase value may be increased in the slave clock FB_CLK in some cases. For example, the pulse may be returned to a position close to $-\pi$.

As the time progresses, the pulse position starts to move in a direction in which the phase of the slave clock FB_CLK is decreased. When the pulse of the slave clock FB_CLK 62 is located on the right side with respect to the first threshold, the phase return operation is executed, and the pulse position is returned to a position in the vicinity of the center of the phase range between $-\pi$ and $+\pi$. Along with the phase return operation into the positive direction, the count value is decreased from 1 to 0. Although the pulse position is returned to a position in the vicinity of the center of the phase range between $-\pi$ and $+\pi$, the returning position for the pulse may be arbitrary. When the pulse 61 is located on the left side with respect to the first threshold, the phase value may be decreased in the slave clock FB_CLK in some cases. For example, the pulse may be returned to a position close to $+\pi$.

Figure 11A:
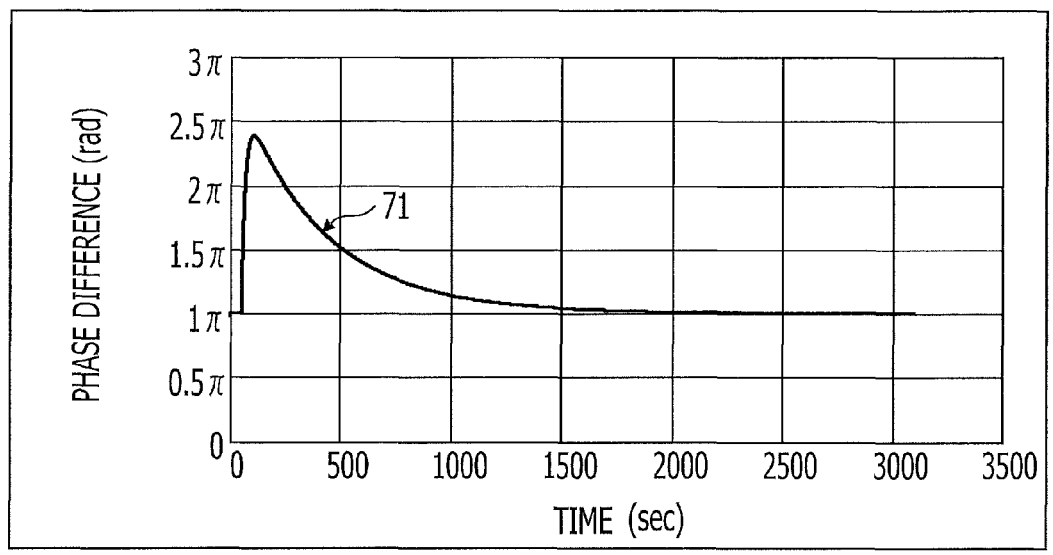
FIG. 11A and FIG. 11B illustrate an exemplary simulation result.
Figure 11B:
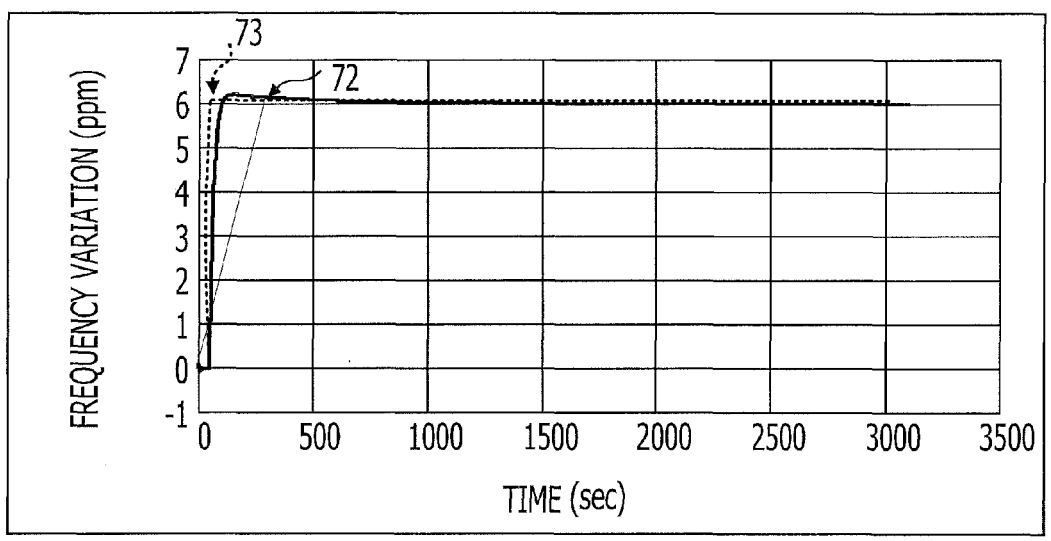

FIG. 11A and FIG. 11B illustrate an exemplary simulation result. The simulation result illustrated in FIG. 11A and FIG. 11B may be a simulation result of the pull-in operation by the digital PLL circuit illustrated in FIG. 1. In FIG. 11A, a horizontal axis represents a time, and a vertical axis represents a phase difference between the master clock and the slave clock. In FIG. 11B, a horizontal axis represents a time, and a vertical axis represents a frequency variation. With regard to a simulation input 73 illustrated in FIG. 11B, from a state in which a frequency difference between the master clock and the slave clock does not exist, the frequency of the master clock may fluctuate by 6 ppm in a step function manner. A phase difference change 71 illustrated in FIG. 11A is generated in response to the frequency fluctuation of the master clock. As indicated by the phase difference change 71, when the phase difference exceeds $2\pi$ for the first time, thereafter, the phase difference is decreased in a stable state to eventually converge to 0. Even when the phase difference exceeds $2\pi$, the cycle slip does not occur, the phase difference stably converges. Along with this, in FIG. 11B, as indicated by a frequency change 72 of the slave clock, the frequency of the slave clock stably follows the frequency of the master clock.

Figure 12A:
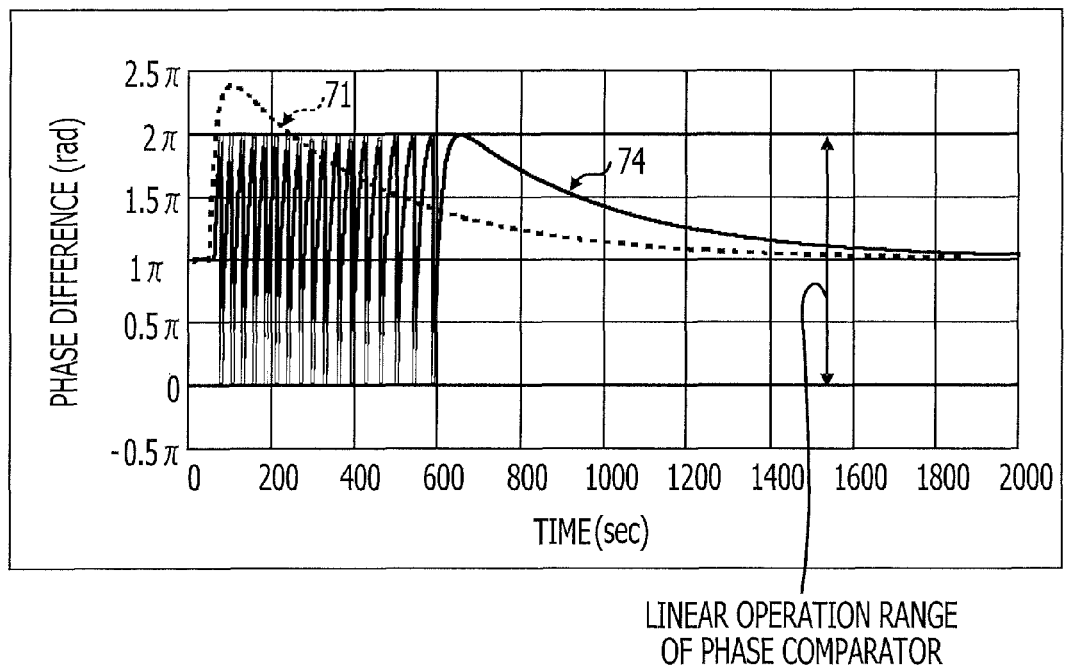
FIG. 12A and FIG. 12B illustrate an exemplary simulation result.
Figure 12B:
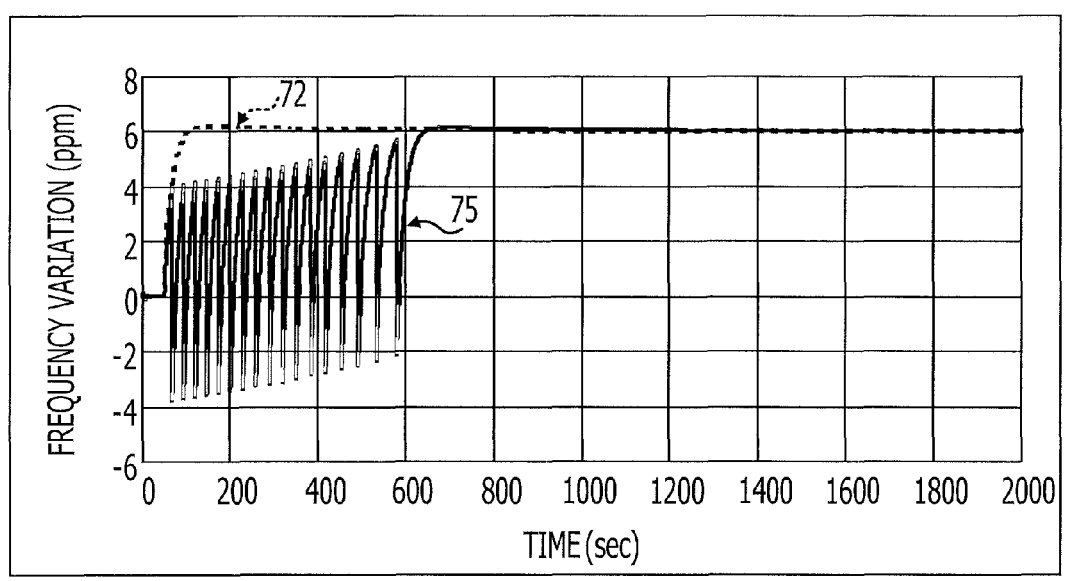

FIG. 12A and FIG. 12B illustrate an exemplary simulation result. The simulation result illustrated in FIG. 12A and FIG. 12B may be a simulation result of the pull-in operation by the digital PLL circuit. In FIG. 12A, a horizontal axis represents a time, and a vertical axis represents a phase difference between the master clock and the slave clock. In FIG. 12B, a horizontal axis represents a time, and a vertical axis represents a frequency variation. A simulation input may be substantially the same as the simulation input illustrated in FIG. 11B, and from a state in which a frequency difference between the master clock and the slave clock does not exist, the frequency of the master clock may fluctuate by 6 ppm in a step function manner. In response to the frequency fluctuation of the master clock, a phase difference change 74 illustrated in FIG. 12A is generated. As indicated by the phase difference change 74, since the phase difference exceeds $2\pi$, after the cycle slip occurs and the oscillation continues for a long period of time, the phase difference is decreased to eventually converge to 0. The phase difference change 71 may be substantially the same as the phase change 71 illustrated in FIG. 11A to a large extent. In FIG. 12B, as indicated by the frequency change 75 of the slave clock, after the cycle slip occurs and the oscillation continues for a long period of time, the slave clock follows the master clock. The frequency change 72 may be substantially the same as the frequency change 72 illustrated in FIG. 11B. For example, in the digital PLL circuit illustrated in FIG. 1, since the phase difference detection value is corrected to calculate the phase value where the range is not limited, and the slave clock is generated based on the phase value, the stable pull-in operation may be carried out. For example, the oscillation generated while the phase value folds based on the range limitation between 0 and $2\pi$ is reduced, and the stable pull-in operation may be carried out.

Figure 13:
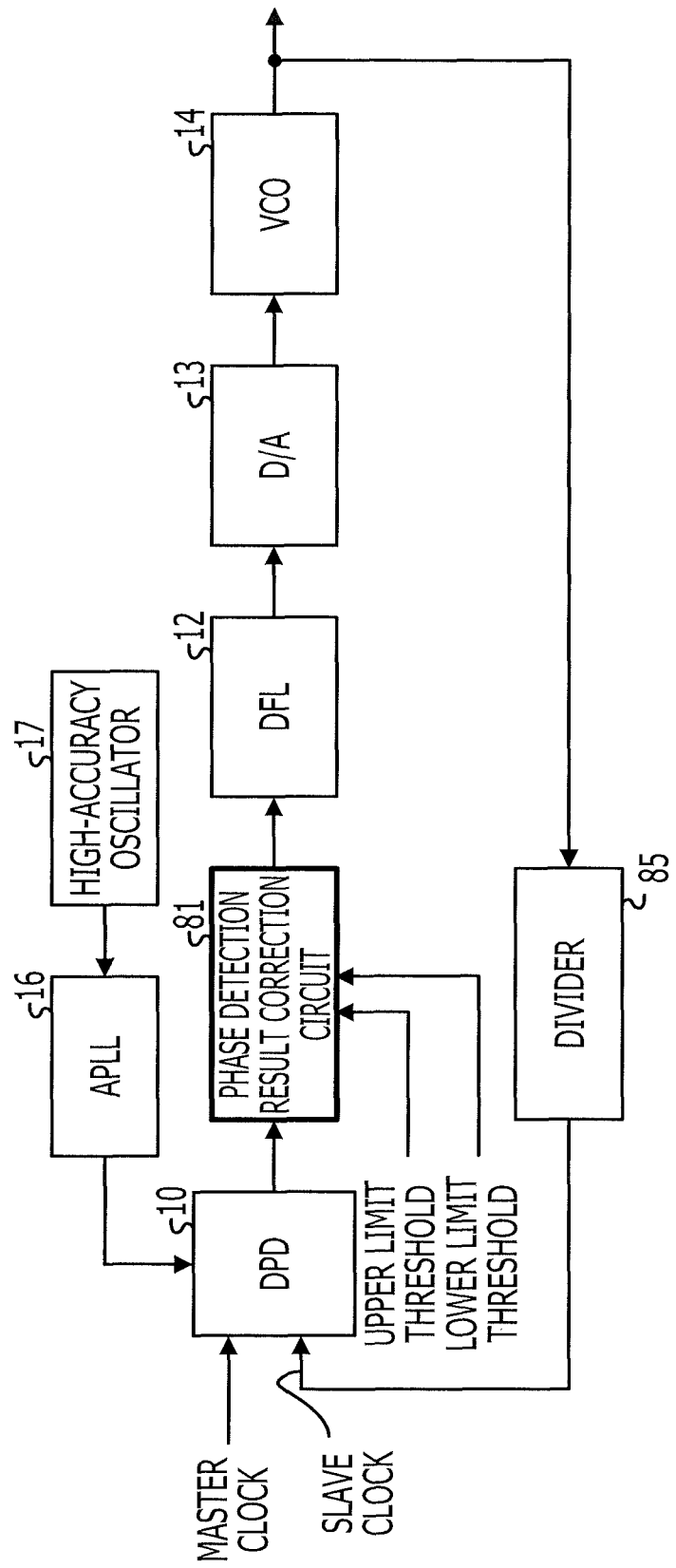
FIG. 13 illustrates an exemplary digital PLL circuit.

FIG. 13 illustrates an exemplary digital PLL circuit. In FIG. 13, components that are substantially the same as or similar to the components illustrated in FIG. 1 are assigned with the same numerals, and a description may be omitted or reduced. The digital PLL circuit illustrated in FIG. 13 includes the digital phase comparator (DPD) 10, a phase detection result correction circuit 81, a digital loop filter (DLF) 12, the DA converter (D/A) 13, the voltage controlled oscillator (VCO) 14, and a divider 85. The digital PLL circuit includes the analog PLL (APLL) 16 and the high-accuracy oscillator 17 as a phase count clock generator. In FIG. 13, the phase detection result correction circuit 81 and the divider 85 are provided instead of the phase detection result correction circuit 11 and the divider 15 having the phase control function of FIG. 1.

As illustrated in FIG. 1, the phase difference detection value output by the digital phase comparator 10 may be a digital value, for example, indicating a phase difference within a range between 0 and $2\pi$. A lower limit and an upper limit of the range may be arbitrary, and the range may be a range between 0 and $2\pi$ or $-\pi$ and $+\pi$.

The phase detection result correction circuit 81 corrects the phase difference detection value to a phase value that is not limited by the range in accordance with a comparison result between the phase difference detection value and the threshold. The slave clock generation circuit may include the digital loop filter 12, the DA converter 13, the voltage controlled oscillator 14, and the divider 85. The slave clock generation circuit generates a slave clock in accordance with the phase value after the correction output by the phase detection result correction circuit 81. For example, the phase value after the correction is subjected to time averaging by the digital loop filter 12, and the count value after the averaging is converted by the DA converter 13 to an analog voltage. The voltage controlled oscillator 14 oscillates a clock signal of a frequency in accordance with this analog voltage. The oscillated clock signal is divided by the divider 85 at a certain division ratio, and the obtained division clock signal is applied to the digital phase comparator 10 as a slave clock. Through the feedback control, an oscillation clock signal of the voltage controlled oscillator 14 may be controlled so that the frequency of the master clock is substantially equal to the frequency of the slave clock and also the phases have a certain phase relationship.

Figure 14:
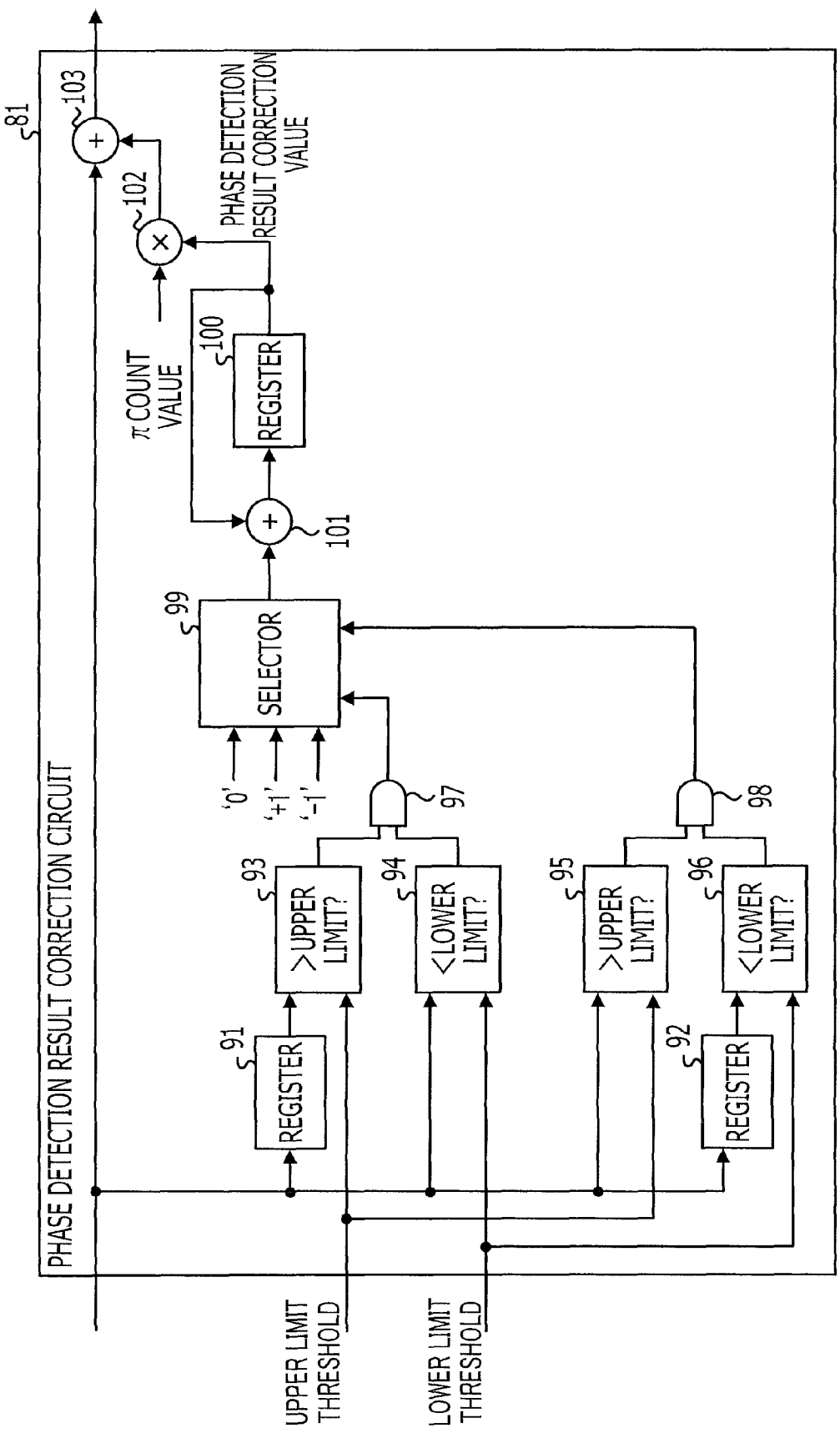
FIG. 14 illustrates an exemplary phase detection result correction circuit.

FIG. 14 illustrates an exemplary phase detection result correction circuit. The phase detection result correction circuit illustrated in FIG. 14 may be the phase detection result correction circuit illustrated in FIG. 13. The phase detection result correction circuit 81 includes registers 91 and 92, comparators 93 to 96, AND circuits 97 and 98, a selector 99, a register 100, an adder 101, an integrator 102, and an adder 103. The comparators 93 to 96 compare a phase difference detection value with a threshold. A comparison result between the phase difference detection value and the threshold includes a first state, a second state, or a third state. When the first state is detected, the phase detection result correction circuit 81 decreases the count value stored in the register 100 by 1. When the second state is detected, the phase detection result correction circuit 81 increases the count value by 1.

When the third state is detected, the phase detection result correction circuit 81 holds the count value as it is. The integrator 102 of the phase detection result correction circuit 81 obtains a value by integrating the count value with the certain phase amount, for example, the $\pi$ count value. The adder 103 of the phase detection result correction circuit 81 obtains the phase value after the correction by adding to the value obtained by the integrator 102 to the phase detection value from the digital phase comparator 10.

The threshold applied to the comparators 93 to 96 as the comparison target includes a first threshold located in a range between 0 and $2\pi$ on a side where the phase is lower as compared with the center of the range, for example, a lower limit threshold and a second threshold located on a side where the phase is larger as compared with the center of the range, for example, an upper limit threshold. In the first state, immediately after the phase difference detection value becomes smaller than the first threshold, the phase difference detection value becomes larger than the second threshold. In the second state, immediately after the phase difference detection value becomes larger than the second threshold, the phase difference detection value becomes smaller than the first threshold. For example, the comparator 93 compares the phase difference detection value at a certain detection timing to be stored in the register 91 with the second threshold and asserts the output when the phase difference detection value becomes larger than the second threshold. The comparator 94 compares the phase difference detection value at the next detection timing with the first threshold and asserts the output when the phase difference detection value becomes smaller than the first threshold. When the phase difference detection value detected at the certain detection timing becomes larger than the second threshold and also the phase difference detection value detected at the next detection timing becomes smaller than the first threshold, the AND circuit 97 detects the second state and asserts the output. The comparator 96 compares the phase difference detection value at a certain detection timing to be stored in the register 92 with the first threshold and asserts the output when the phase difference detection value becomes larger than the first threshold. The comparator 95 compares the phase difference detection value at the next detection timing with the second threshold and asserts the output when the phase difference detection value becomes larger than the second threshold. When the phase difference detection value detected at the certain detection timing becomes smaller than the first threshold and also the phase difference detection value detected at the next detection timing becomes larger than the second threshold, the AND circuit 98 detects the first state and asserts the output.

In response to the assertion state of the output of the AND circuit 97, for example, the second state, the selector 99 selects and outputs +1. In response to the assertion state of the output of the AND circuit 98, for example, the first state, the selector 99 selects and outputs −1. When both the first state and the second state are not detected, for example, when the third state is established, the selector 99 selects and outputs 0. The output of the selector 99 is added by the adder 101 to the stored value in the register 100, for example, the count value. The addition result is stored in the register 100 as the count value after the update. The integrator 102 integrates the count value of the register 100 with the certain phase amount, for example, the count value corresponding to the phase amount $\pi$ and supplies the integration result to the adder 103. The adder 103 adds the phase difference detection value from the digital phase comparator 10 to the integration result to obtain the phase value after the correction.

In the digital PLL circuit illustrated in FIG. 1, when the phase difference detection value is close to the end of the phase range, the phase return operation is executed to detach the phase difference detection value from the end. Along with the phase return operation, the certain phase amount is added to the phase difference detection value, and the phase value after the correction is obtained. In the digital PLL circuit illustrated in FIG. 13, when the phase difference detection value passes through the end of the phase range is detected, for example, when the phase difference detection value exceeds the end of the phase range is detected, the certain phase amount is added to the phase difference detection value, and the phase value after the correction is obtained. When the phase difference detection value passes through the end of the phase range, since the phase difference detection value transits to the end on the opposite side through the folding of the phase value, the appropriate correction result is obtained by adding the certain phase amount to the phase difference detection value.

Figure 15:
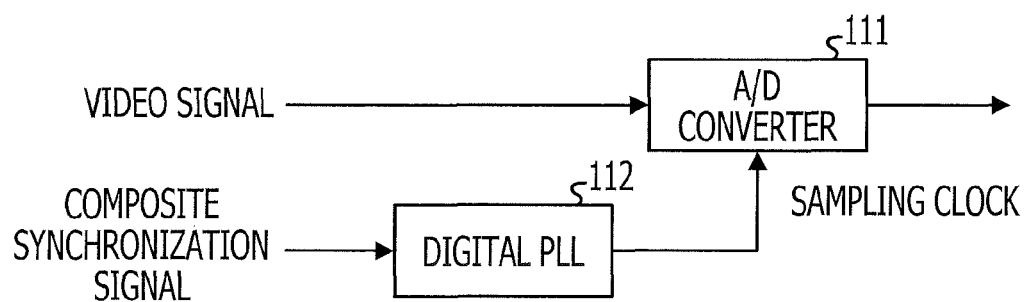
FIG. 15 illustrates an exemplary system.

FIG. 15 illustrates an exemplary system. In the system illustrated in FIG. 15, the digital PLL circuit illustrated in FIG. 1 or FIG. 13 may be applied. The system illustrated in FIG. 15 includes an A/D converter 111 and a digital PLL circuit 112. The A/D converter 111 receives an analog video signal and converts the analog video signal into a digital video signal. At the time of the signal conversion, the A/D converter 111 samples and holds an analog voltage of the analog video signal in synchronization with a certain sampling clock and converts the analog voltage to a digital value through a parallel or sequential process. The digital PLL circuit 112 generates a sampling clock in synchronization with the reference clock using a composite synchronization signal or the like as the reference clock, for example, the master clock. The digital PLL circuit 112 may be the digital PLL circuit illustrated in FIG. 1 or FIG. 13. Without an influence from the range limitation of the phase difference detection value, the pull-in operation may be executed at a high speed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A digital PLL circuit comprising:
a digital phase comparator to detect a phase difference between a master clock and a slave clock and output a phase difference detection value;
a correction circuit to correct the phase difference detection value to a phase value in accordance with a comparison result between the phase difference detection value and a threshold; and
a slave clock generation circuit to generate the slave clock in accordance with the phase value.
2. The digital PLL circuit according to claim 1,
wherein the digital phase comparator outputs the phase difference detection value in a range, and
wherein the correction circuit corrects the phase detection value to the phase value that is not limited by the range.

3. The digital PLL circuit according to claim 1,
wherein the correction circuit adds a value obtained by integrating a count value based on the comparison result with a phase amount to the phase detection value to obtain the phase value.
4. The digital PLL circuit according to claim 3,
wherein the correction circuit
decreases the count value when the comparison result indicates a first comparison result,
increases the count value when the comparison result indicates a second comparison result, and
maintains the count value when the comparison result indicates a third comparison result.
5. The digital PLL circuit according to claim 1,
wherein the correction circuit includes:
a comparison circuit to compare the phase difference detection value with a threshold;
a register to perform a count based on the comparison result and store the count value;
an integrator to integrate the count value with the phase amount; and
an adder to add an integration result to the phase detection value.
6. The digital PLL circuit according to claim 1,
Wherein, within the range, the threshold includes a first threshold located on a side where a phase is smaller as compared with a center of the range and a second threshold located on a side where the phase is larger as compared with the center of the range.
7. The digital PLL circuit according to claim 6,
wherein the correction circuit instructs the slave clock generation circuit to increase the phase difference detection value when the phase difference detection value is smaller than the first threshold, and
instructs the slave clock generation circuit to decrease the phase difference detection value when the phase difference detection value is larger than the second threshold.
8. The digital PLL circuit according to claim 1,
wherein the slave clock generation circuit includes:
a voltage control oscillator to oscillate a clock of a frequency corresponding to the phase value; and
a divider to divide the clock oscillated by the voltage control oscillator,
wherein the divider reconfigures an internal state in response to an instruction from the correction circuit.
9. The digital PLL circuit according to claim 6,
wherein the correction circuit detects a first comparison result when the phase difference detection value detected at a first detection timing is smaller than the first threshold and the phase difference detection value detected at a second detection timing is larger than the second threshold, and
detects a second comparison result when the phase difference detection value detected at the first detection timing is larger than the second threshold and the phase difference detection value detected at the second detection timing is smaller than the first threshold.
10. A clock generation method in a digital PLL circuit, the clock generation method comprising:
detecting a phase difference between a master clock and a slave clock and outputting a phase difference detection value;
correcting the phase difference detection value to a phase value in accordance with a comparison result between the phase difference detection value and a threshold; and
generating the slave clock in accordance with the phase value.

11. The clock generation method according to claim 10, further comprising:
outputting the phase difference detection value in a range; and
correcting the phase detection value to the phase value that is not limited by the range.

12. The clock generation method according to claim 10, further comprising:
adding a value obtained by integrating a count value based on the comparison result with a phase amount to the phase detection value to obtain the phase value.

13. The clock generation method according to claim 12, further comprising:
decreasing the count value when the comparison result indicates a first comparison result;
increasing the count value when the comparison result indicates a second comparison result; and
maintaining the count value when the comparison result indicates a third comparison result.

14. The clock generation method according to claim 10, wherein, within the, the threshold includes a first threshold located on a side where a phase is smaller as compared with a center of the range and a second threshold located on a side where the phase is larger as compared with the center of the range.

15. The clock generation method according to claim 14, further comprising:
instructing a slave clock generation circuit to increase the phase difference detection value when the phase difference detection value is smaller than the first threshold; and
instructing the slave clock generation circuit to decrease the phase difference detection value when the phase difference detection value is larger than the second threshold by a correction circuit.

16. The clock generation method according to claim 10, further comprising:
dividing a clock of a frequency corresponding to the phase value in accordance with the comparison result; and
reconfiguring an internal state in response to an instruction.

17. The clock generation method according to claim 14, further comprising:
detecting a first comparison result when the phase difference detection value detected at a first detection timing is smaller than the first threshold and also the phase difference detection value detected at a second detection timing is larger than the second threshold; and
detecting a second comparison result when the phase difference detection value detected at the first detection timing is larger than the second threshold and the phase difference detection value detected at the second detection timing is smaller than the first threshold.

* * * * *

UNITED STATES PATENT AND TRADEMARK OFFICE
CERTIFICATE OF CORRECTION

PATENT NO. : 8,436,665 B2
APPLICATION NO. : 13/418721
DATED : May 7, 2013
INVENTOR(S) : Koji Nakamuta et al.

It is certified that error appears in the above-identified patent and that said Letters Patent is hereby corrected as shown below:

In the Claims:

Column 12, Line 25, In Claim 6, delete "Wherein," and insert -- wherein, --, therefor.
Column 13, Line 21, In Claim 14, delete "within the," and insert -- within a range, --, therefor.

Signed and Sealed this
Twenty-seventh Day of August, 2013

Teresa Stanek Rea
*Acting Director of the United States Patent and Trademark Office*